US012660479B2

(12) United States Patent
Ushikubo

(10) Patent No.: US 12,660,479 B2
(45) Date of Patent: Jun. 16, 2026

(54) ORGANIC ELECTROLUMINESCENCE DISPLAY DEVICE AND METHOD OF MANUFACTURING THE SAME

(71) Applicant: Magnolia White Corporation, Tokyo (JP)

(72) Inventor: Takahiro Ushikubo, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 525 days.

(21) Appl. No.: 18/303,652

(22) Filed: Apr. 20, 2023

(65) Prior Publication Data

US 2023/0345802 A1 Oct. 26, 2023

(30) Foreign Application Priority Data

Apr. 26, 2022 (JP) ................................. 2022-072457

(51) Int. Cl.
*H10K 59/80* (2023.01)
*H10K 59/12* (2023.01)
*H10K 59/122* (2023.01)

(52) U.S. Cl.
CPC ....... *H10K 59/873* (2023.02); *H10K 59/1201* (2023.02); *H10K 59/122* (2023.02)

(58) Field of Classification Search
CPC .............. H10K 59/873; H10K 59/1201; H10K 59/122; H10K 59/30; H10K 59/35; H10K 50/157; H10K 50/19
See application file for complete search history.

(56) References Cited

U.S. PATENT DOCUMENTS

2013/0122410 A1* 5/2013 Nagai .................. G03G 5/0661
430/58.5
2023/0371334 A1* 11/2023 Levermore ............ H10K 59/32
2024/0155863 A1* 5/2024 Yoshiyasu ............ H10K 59/121

FOREIGN PATENT DOCUMENTS

JP 2008-243559 A 10/2008

* cited by examiner

*Primary Examiner* — Calvin Y Choi
(74) *Attorney, Agent, or Firm* — Michael Best & Friedrich LLP

(57) ABSTRACT

Provided is an organic EL display device and a method for manufacturing the same having the characteristics that are less deteriorated even if some layers are exposed to a solvent or the atmosphere when performing photolithography. An organic electroluminescence display device includes a plurality of pixel each including a plurality of sub-pixels, a substrate, a lower electrode, an organic EL layer including an emission layer that emits a different color for each sub-pixel, and an upper electrode disposed on an upper side of the organic EL layer. An exposure protective layer is disposed between the organic EL layer and the upper electrode, where the exposure protective layer includes a protective charge generation layer and a first protective hole transport layer that are laminated in this order for each sub-pixel, and the emission layer is not provided between the exposure protective layer and the upper electrode.

6 Claims, 10 Drawing Sheets

Figure 9:
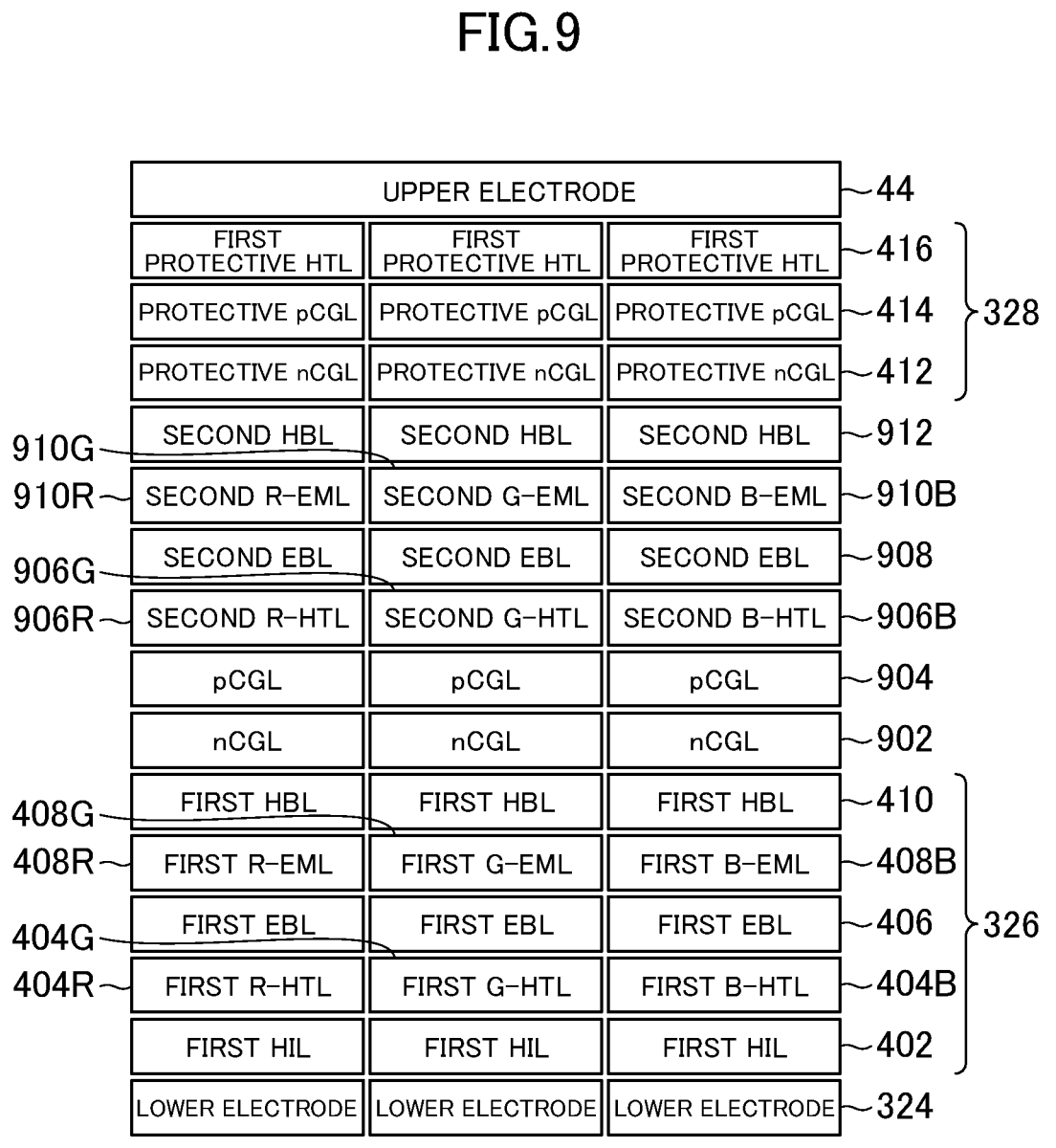

| | | | |
|---|---|---|---|
| UPPER ELECTRODE | | | ~44 |
| FIRST PROTECTIVE HTL | FIRST PROTECTIVE HTL | FIRST PROTECTIVE HTL | ~416 |
| PROTECTIVE pCGL | PROTECTIVE pCGL | PROTECTIVE pCGL | ~414 |
| PROTECTIVE nCGL | PROTECTIVE nCGL | PROTECTIVE nCGL | ~412 |
| SECOND HBL | SECOND HBL | SECOND HBL | ~912 |
| SECOND R-EML | SECOND G-EML | SECOND B-EML | ~910B |
| SECOND EBL | SECOND EBL | SECOND EBL | ~908 |
| SECOND R-HTL | SECOND G-HTL | SECOND B-HTL | ~906B |
| pCGL | pCGL | pCGL | ~904 |
| nCGL | nCGL | nCGL | ~902 |
| FIRST HBL | FIRST HBL | FIRST HBL | ~410 |
| FIRST R-EML | FIRST G-EML | FIRST B-EML | ~408B |
| FIRST EBL | FIRST EBL | FIRST EBL | ~406 |
| FIRST R-HTL | FIRST G-HTL | FIRST B-HTL | ~404B |
| FIRST HIL | FIRST HIL | FIRST HIL | ~402 |
| LOWER ELECTRODE | LOWER ELECTRODE | LOWER ELECTRODE | ~324 |

328

326

910G
910R 906G
906R 408G
408R 404G
404R

ORGANIC ELECTROLUMINESCENCE DISPLAY DEVICE AND METHOD OF MANUFACTURING THE SAME

CROSS-REFERENCE TO RELATED APPLICATION

The present application claims priority from Japanese Application No. JP2022-72457 filed on Apr. 26, 2022, the content of which is hereby incorporated by reference into this application.

BACK GROUND OF THE INVENTION

1. Field of the Invention

The present invention relates to an organic electroluminescence display device and a method of manufacturing the organic electroluminescence display device.

2. Description of the Related Art

An organic electroluminescence (EL) device includes a thin film transistor (TFT) and an organic light emitting diode (OLED) formed on a substrate. The OLED includes an organic layer between a pair of electrodes. The organic layer is formed of a lamination of a hole transport layer, an emission layer, and an electron transport layer, for example. The emission layer may be formed of a material that emits white light, or a material that emits a different color for each sub-pixel constituting a pixel.

When the emission layer is formed of a material that emits white light, there are several issues, for example, current leakage may occur between adjacent sub-pixels (see JP2008-243559A), or luminance may be lowered due to absorption of light by a color filter. As such, in recent years, the emission layer is often formed of a material that emits a different color for each sub-pixel.

In order to solve the above problem, JP2008-243559A discloses removing the hole transport layer formed on the partition wall to be a path through which a leakage current flows.

SUMMARY OF THE INVENTION

When an emission layer that emits a different color for each sub-pixel is formed, it is possible to reduce the leakage current between adjacent pixels and the absorption of light by a color filter. However, organic EL layers need to be formed by photolithography, and thus, some of the layers may be exposed to the atmosphere or a solvent and the properties may deteriorate.

One or more embodiments of the present disclosure have been conceived in view of the above, and an object thereof is to provide an organic EL display device and a method for manufacturing the same having the characteristics that are less deteriorated even if some layers are exposed to a solvent or the atmosphere when performing photolithography.

One or more embodiments of the present invention have been conceived in view of the above, and an organic electroluminescence display device according to the present disclosure includes a substrate and a plurality of pixels provided on the substrate, wherein each of the plurality of pixel includes a plurality of sub-pixels, each of the plurality of sub-pixels includes a lower electrode provided on an upper side of the substrate, an organic EL layer including an emission layer that is disposed on the lower electrode and emits a different color for each sub-pixel, and an upper electrode disposed on an upper side of the organic EL layer. An exposure protective layer is disposed between the organic EL layer and the upper electrode, the exposure protective layer including a protective charge generation layer and a first protective hole transport layer that are laminated in this order for each sub-pixel, and the emission layer is not provided between the exposure protective layer and the upper electrode.

A method according to another aspect of the present disclosure for manufacturing an organic electroluminescence display device that includes a substrate and a plurality of pixels provided on the substrate includes the steps of forming a lower electrode on an upper side of the substrate, forming an organic EL layer on the lower electrode, the organic EL layer including an emission layer that emits a different color for each sub-pixel, forming an exposure protective layer that is in contact with the organic EL layer and includes a protective charge generation layer and a first protective hole transport layer, which are laminated in this order for each sub-pixel, and forming an upper electrode on an upper side of the exposure protective layer, wherein an emission layer is not formed between the exposure protective layer and the upper electrode.

According to the present invention, it is possible to provide an organic EL display device and a method for manufacturing the same having the characteristics that are less deteriorated even if some layers are exposed to a solvent or the atmosphere when performing photolithography.

BRIEF DESCRIPTION OF THE DRAWINGS

FIG. 9 is a diagram illustrating a layer structure of an organic EL layer and an exposure protective layer according to the second embodiment.

DETAILED DESCRIPTION OF THE INVENTION

First Embodiment

Figure 1:
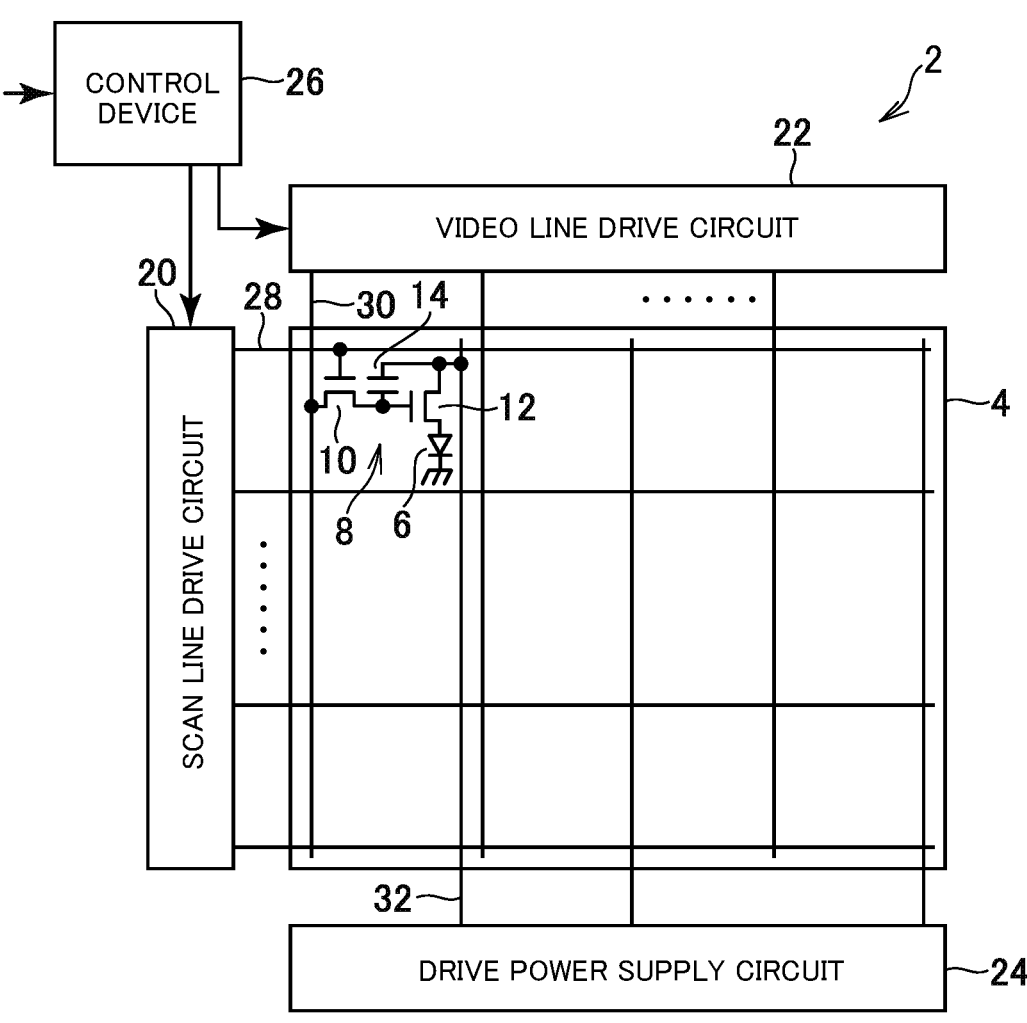
FIG. 1 is a schematic diagram for illustrating a configuration of an organic EL display device according to an embodiment.

Embodiments of the present invention will be described below in detail with reference to the accompanying drawings.

The accompanying drawings may schematically illustrate widths, thicknesses, shapes, or other characteristics of each part for clarity of illustration, compared to actual configurations. However, such a schematic illustration is merely an example and not intended to limit the present invention. In this specification and each drawing, the same elements as those already described with reference to the already-presented drawings are denoted by the same reference numerals, and detailed description thereof may be appropriately omitted.

FIG. 1 is a schematic diagram for illustrating a configuration of an organic EL display device 2 according to the present embodiment. The organic EL display device 2 includes a pixel array unit 4 for displaying images and a driving unit for driving the pixel array unit 4. The organic EL display device 2 has a laminated structure including, for example, TFTs 10 and 12 and an OLED 6 formed on a substrate 300 (see FIG. 4). The schematic diagram shown in FIG. 1 is merely an example, and the present embodiment is not limited thereto.

The pixel array unit 4 includes pixels, each having an OLED 6 and a pixel circuit 8, disposed in a matrix. The pixel circuit 8 includes a plurality of TFTs 10 and 12 and capacitors 14.

The driving unit includes a scan line drive circuit 20, a video line drive circuit 22, a drive power supply circuit 24, and a control device 26, and drives the pixel circuit 8 to control the emission of the OLED 6.

The scan line drive circuit 20 is connected to a scanning signal line 28 provided for each horizontal pixel array (pixel row). The scan line drive circuit 20 sequentially selects the scanning signal lines 28 in response to a timing signal from the control device 26 and applies a voltage to the selected scanning signal line 28 to turn on a lighting TFT 10.

The video line drive circuit 22 is connected to a video signal line 30 provided for each vertical pixel array (pixel column). The video line drive circuit 22 receives a video signal from the control device 26, and, in accordance with the selection of the scanning signal line 28 by the scanning line drive circuit 20, outputs a voltage corresponding to the video signal in the selected pixel row to each video signal line 30. The voltage is written to the capacitor 14 via the lighting TFT 10 at the selected pixel row. The drive TFT 12 supplies a current corresponding to the written voltage to the OLED 6, whereby the OLED 6 of the pixel corresponding to the selected scanning signal line 28 emits light.

The drive power supply circuit 24 is connected to a drive power supply line 32 provided for each pixel column, and supplies a current to the OLED 6 via the drive power supply line 32 and the drive TFT 12 in the selected pixel row.

A lower electrode 324 (see FIGS. 3 and 4) of the OLED 6 is connected to the drive TFT 12. An upper electrode 44 (see FIGS. 2 and 4) of each OLED 6 is formed of an electrode common to OLEDs 6 of all the pixels. When the lower electrode 324 is configured as an anode, a high potential is input, and the upper electrode 44 becomes a cathode and a low potential is input. When the lower electrode 324 is formed as a cathode, a low electric potential is entered in the lower electrode. In this case, the upper electrode 44 is an anode and supplied with a high electric potential.

Figure 2:
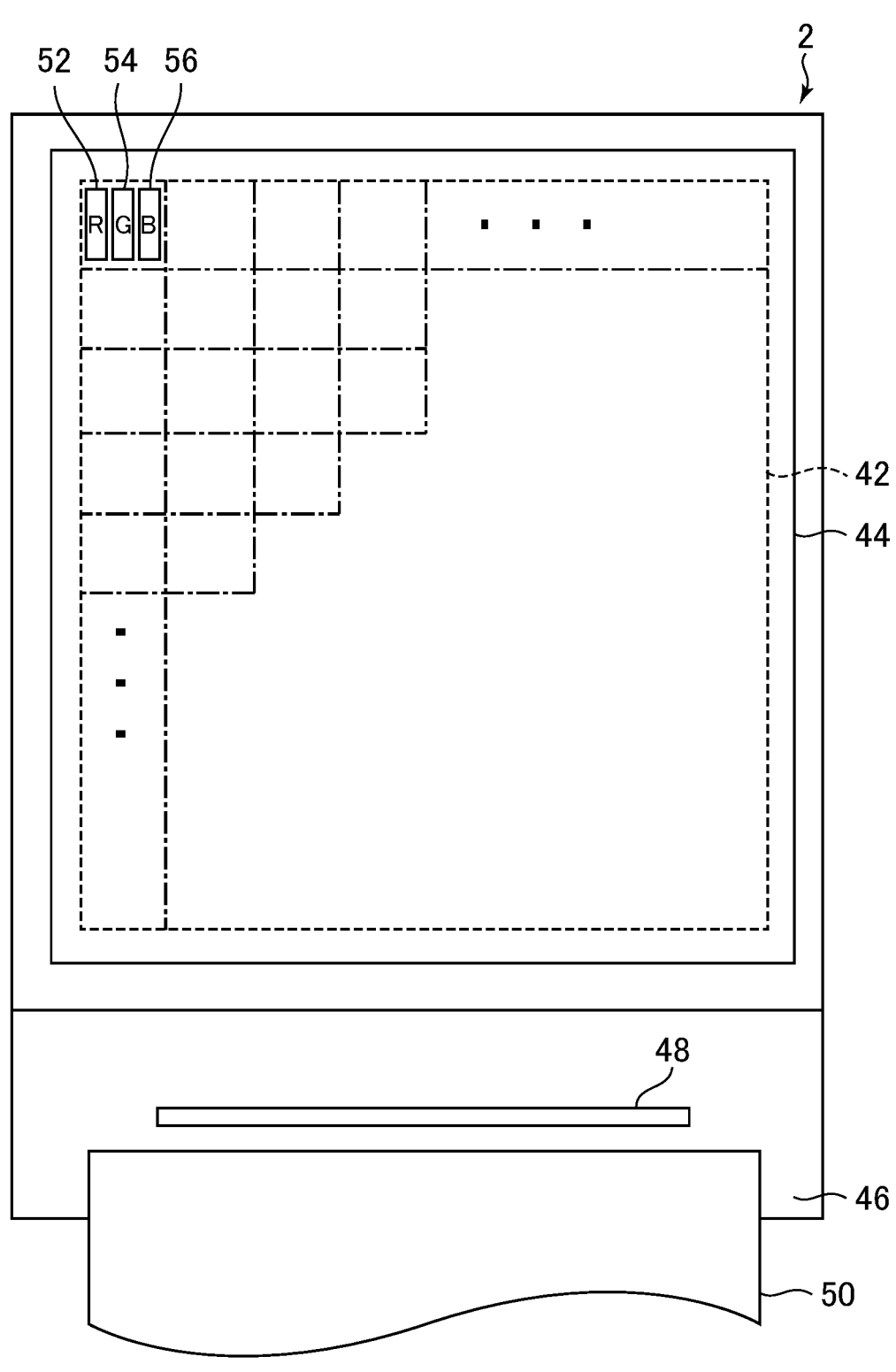
FIG. 2 is a schematic plan view of the organic EL display device according to the embodiment.

FIG. 2 is a schematic plan view of an example of the organic EL display device 2 shown in FIG. 1. The pixel array unit 4 shown in FIG. 1 is provided in a display area 42 of the organic EL display device 2 and the OLEDs 6 are disposed in the pixel array unit 4 as described above. As described above, the upper electrode 44 constituting the OLEDs 6 is commonly formed in the respective pixels and covers the entire display area 42.

On one side of the rectangular organic EL display device 2 includes a component mounting area 46, in which wires to the display area 42 are disposed. The component mounting area 46 includes a driver integrated circuit (IC) 48 constituting the driving unit, and is connected to a flexible printed circuit board (FPC) 50. The FPC 50 is connected to the control device 26 or other circuits 20, 22, and 24, for example, and includes an IC mounted thereon.

Each pixel includes a plurality of sub-pixels. Specifically, for example, each pixel includes a first sub-pixel 52 that emits red light, a second sub-pixel 54 that emits green light, and a third sub-element 56 that emits blue light.

Figure 3:
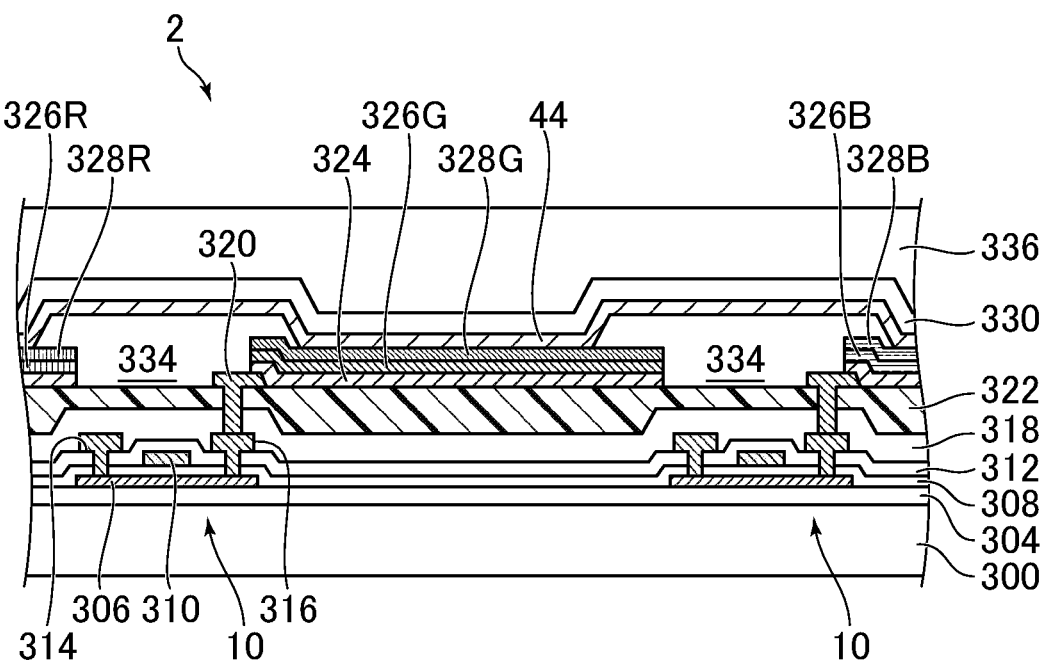
FIG. 3 is a diagram illustrating a cross section of the organic EL display device around a pixel.

FIG. 3 is a diagram illustrating a cross section of the organic EL display device 2 around a pixel. In FIG. 3, hatching of some layers is omitted for simplifying the structure of the cross section. In the following, the direction of lamination is an upward direction.

A substrate 300 is made of a flexible resin such as polyimide. The upper surface of the substrate 300 is covered with an undercoat layer 304. A semiconductor layer 306 is formed on the undercoat layer 304 and covered with a gate insulating film 308. A gate electrode 310 is formed on the gate insulating film 308 and covered with a passivation film 312. A drain electrode 314 and a source electrode 316 are connected to the semiconductor layer 306 through the gate insulating film 308 and the passivation film 312. The semiconductor layer 306, the gate electrode 310, the drain electrode 314, and the source electrode 316 form a lighting TFT 10. The lighting TFTs 10 are provided so as to respectively correspond to a plurality of unit pixels. The undercoat layer 304, the gate insulating film 308, and the passivation film 312 are formed of an inorganic insulating material, such as $SiO_2$ and SiN. The semiconductor layers 306 are made of a semiconductor, such as LTPS (low temperature polysilicon).

The drain electrode 314 and the source electrode 316 are covered with the interlayer insulating film 318, which is covered with a flattening film 322. The drain electrode 314 and the source electrode 316 are formed of a conductive material including Al, Ag, Cu, Ni, Ti, and Mo, for example. The interlayer insulating film 318 is formed of an inorganic insulating material, such as $SiO_2$ and SiN. The flattening film 322 is formed of an organic insulating material, such as an acrylic resin, and has a flat upper surface.

The lower electrode 324 is formed on the flattening film 322. The lower electrode 324 is connected to a connection electrode 320 penetrating through the flattening film 322 and the interlayer insulating film 318 and connected to the source electrode 316. The lower electrodes 324 are provided so as to respectively correspond to the unit pixels. In the present embodiment, the organic EL display device 2 is a top-emission type, and the lower electrode 324 is formed as a reflective electrode. The lower electrode 324 is formed of a conductive material including Al, Ag, Cu, Ni, Ti, and Mo, and a conductive oxide, such as ITO and IZO.

The organic EL layer 326 is provided on the lower electrode 324 and includes an emission layer that emits a color differently for each sub-pixel. Specifically, the organic EL layer 326 is disposed on the lower electrodes 324 that are provided for respective sub-pixels. The organic EL layer 326 of each sub-pixel emits light of a specific color for each sub-pixel. The configuration of the organic EL layer 326 will be described later in detail.

The exposure protective layer 328 is disposed between the organic EL layer 326 and the upper electrode 44, and includes a protective charge generation layer and a first protective hole transport layer 416 (see FIG. 4) that are laminated for each sub-pixel in this order. The configuration of the exposure protective layer 328 will be described later in detail. In the drawings, the charge generation layer is referred to as CGL, and the hole transport layer is referred to as HTL.

A bank 334 is disposed between adjacent sub-pixels to partition the adjacent sub-pixels. Specifically, the bank 334 is disposed across from an end of the exposure protective layer 328 disposed in one sub-pixel to an end of the exposure protective layer 328 adjacent to the one sub-pixel. The inner edge of the bank 334 is disposed on the peripheral edge of the exposure protective layer 328, and the bank 334 is tapered in the forward direction such that the width decreases from the bottom to the upper side in a cross-sectional view. The bank 334 is formed of an organic insulating material, such as an acrylic resin and a polyimide resin. The bank 334 thus partitions adjacent sub-pixels. The bank 334 may be disposed below the organic EL layer 326, and the organic EL layer 326 and the exposure protective layer 328 may be disposed over the end of the bank 334. The bank 334 is also referred to as a rib.

The exposure protective layer 328 and the bank 334 are covered by the upper electrode 44. The upper electrode 44 is formed as a uniform film (so-called solid film) extending over the entire display area 42. An organic light-emitting diode (OLED) is constructed with the organic EL layer 326 and the lower electrode 324 and the upper electrode 44 with the organic EL layer 326 inbetween, and one of the lower electrode 324 and the upper electrode 44 serves as an anode and the other serves as a cathode. As such, the organic EL layer 326 emits light by the current flowing between the lower electrode 324 and the upper electrode 44. For example, the upper electrode 44 is formed of a transparent conductive material, such as ITO and IZO or a metallic thin film, such as MgAg. The emission layer is provided only inside the organic EL layer 326. The organic EL display device 2 does not have an emission layer between the exposure protective layer 328 and the upper electrode 44.

The upper electrode 44 is covered by a sealing film 330 (passivation film), thereby being sealed and blocked from moisture. The sealing film 330 is formed of an inorganic insulating material, such as $SiO_2$ and SiN. The sealing film 330 is covered with a protective film 336. The protective film 336 is formed of an organic insulating material such as an acrylic resin, and ensures mechanical resistance.

Figure 4:
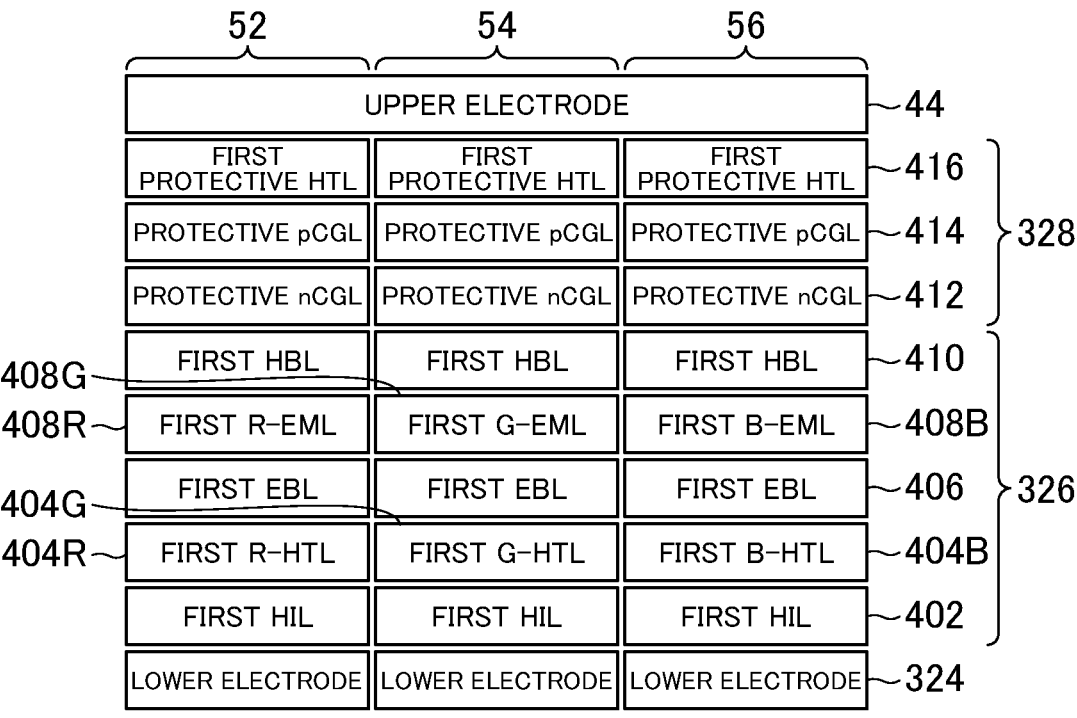
FIG. 4 is a diagram illustrating a layer structure of an organic EL layer and an exposure protective layer according to the first embodiment.

Next, the organic EL layer 326 and the exposure protective layer 328 will be described. FIG. 4 is a diagram for explaining the configuration of the organic EL layer 326 and the exposure protective layer 328 according to the first embodiment, and schematically shows the layer configuration from the lower electrode 324 to the upper electrode 44. In the following, a case will be described in which the lower electrode 324 is an anode and the upper electrode 44 is a cathode.

The organic EL layer 326 includes a first hole injection layer 402, a first hole transport layer 404, a first electron blocking layer 406, a first emission layer 408, and a first hole blocking layer 410. In the drawings, the hole injection layer is referred to as HIL, the electron blocking layer is referred to as EBL, the emission layer is referred to as EML, and the hole blocking layer is referred to as HBL.

The first hole injection layer 402 (first HTL in drawings) is disposed on the lower electrode 324 for each sub-pixel, and a hole is supplied from the lower electrode 324.

The first hole transport layer 404 is disposed in each sub-pixel. Specifically, for example, a first hole transport layer 404R (first R-HTL in drawings) for a sub-pixel that emits red light is disposed on the first sub-pixel 52. A first hole transport layer 404G (first G-HTL in drawings) for a sub-pixel that emits green light is disposed on the second sub-pixel 54. The third sub-pixel 56 includes a first hole transport layer 404B (first B-HTL in drawings) for a sub-pixel that emits blue light. Each of the first hole transport layers 404 is formed in a thickness and a material that are appropriately determined in accordance with the color of light emitted by each of the sub-pixels.

The first electron blocking layer 406 (first EBL in drawings) is disposed on the first hole transport layer 404 to prevent electrons passing through the first emission layer 408 from reaching the first hole transport layer 404.

The first emission layer 408 is disposed on the first electron blocking layer 406 and emits red, green, or blue light. Specifically, each of the first emission layers 408 is formed on the first electron blocking layer 406 for each sub-pixel. For example, as described above, the pixel includes a first sub-pixel 52 that emits red light, a second sub-pixel 54 that emits green light, and a third sub-pixel 56 that emits blue light. In this case, the first emission layer 408R (first R-EML in drawings) of the first sub-pixel 52 is formed of a material that emits red light, the first emission layer 408G (first G-EML in drawings) of the second sub-pixel 54 is formed of a material that emits green light, and the first emission layer 408B (first B-EML in drawings) of the third sub-pixel 56 is formed of a material that emits blue light. When the hole supplied from the lower electrode 324 is combined with the electron supplied from the protective charge generation layer, the first emission layer 408 emits light.

The first hole blocking layer 410 (first HBL in drawings) is disposed on the first emission layer 408 to prevent the hole that penetrates the first emission layer 408 from reaching the first electron transporting layer.

The exposure protective layer 328 is disposed on the organic EL layer 326. Specifically, the exposure protective layer 328 includes a protective charge generation layer and a first protective hole transport layer 416. The protective charge generation layer and the first protective hole transport layer 416 are formed for each sub-pixel. The protective charge generation layers include a protective nCGL 412 (n-type charge generation layer) and a protective pCGL 414 (p-type charge generation layer). The protective nCGL 412 is disposed in contact with the organic EL layer 326, and the protective pCGL 414 is disposed in contact with the protective nCGL 412. The protective nCGL 412 generates electrons when a voltage is applied to the upper electrode 44 and the lower electrode 324, and supplies the electrons to the first emission layer 408 via the first hole blocking layer 410. The first protective hole transport layer 416 is disposed in contact with the protective pCGL 414 and reduces deterioration of the organic EL layer 326 caused by the solvent when the atmospheric exposure or the photolithographic is performed as described later.

The upper electrode 44 is disposed in contact with the exposure protective layer 328. As described above, the upper electrode 44 is provided as a layer common to the sub-pixels.

Next, referring to FIGS. 5A to 7D, a method of manufacturing the organic EL display device 2 according to the first embodiment will be described. The lower electrode 324 and the subsequent layers formed on the substrate 300 are formed using any of the known techniques, and thus are not shown in FIGS. 5A to 7D.

Figure 5A:
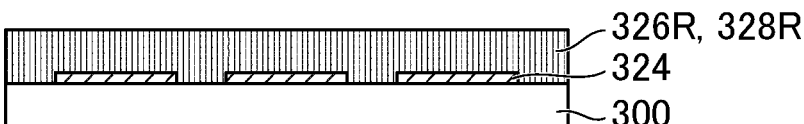
FIGS. 5A to 5D are diagrams for explaining a method of manufacturing the organic EL display device.

First, layers included in the organic EL layer 326 of the first sub-pixel 52 and the exposure protective layer 328 (eight layers from the first hole injection layer 402 to the first protective hole transport layer 416 shown in FIG. 4) are continuously formed on the entire surface of the substrate 300 on which the lower electrode 324 and the subsequent layers are formed (see FIG. 5A). The first emission layer 408R included in the organic EL layer 326 formed in this step includes a material that emits red light. Here, "continuously forming layers" means forming each layer without being exposed to the atmosphere and the solvent then forming the next layer.

Figure 5B:
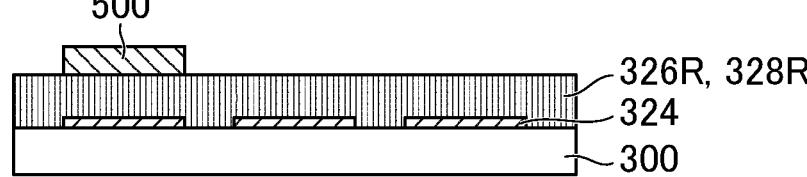

Next, a photoresist 500 is disposed on the lower electrode 324 of the first sub-pixel 52 (FIG. 5B). In this step, for example, the photoresist 500 is applied to the entire surface of the material of the first emission layers 408 applied in FIG. 5A. Subsequently, ultraviolet rays are irradiated only on the lower electrode 324 of the first sub-pixel 52 using a photomask. The photoresist 500 that has not been cured by ultraviolet rays is then cleaned with a solvent to form the photoresist 500 shown in FIG. 5B.

Figure 5C:
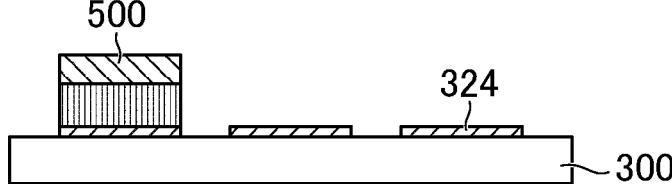

Next, etching is performed (FIG. 5C). Specifically, dry etch removal of the organic EL layer 326 and the exposure protective layer 328 of the first sub-pixel 52 is performed in the entire area where the photoresist 500 is not disposed in the step shown in FIG. 5B. The organic EL layer 326 and the exposure protective layer 328 formed in the step shown in FIG. 5A are etched and left only in the area below the photoresist 500 disposed in the step of FIG. 5B.

Figure 5D:
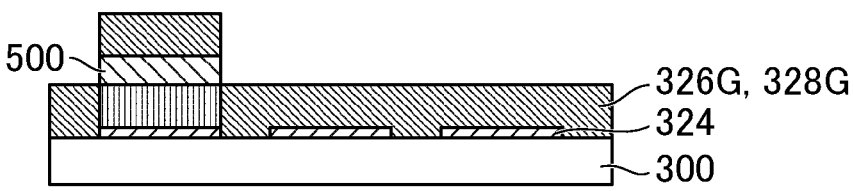

Next, layers (eight layers from the first hole injection layer 402 to the first protective hole transport layer 416) included in the organic EL layer 326 and the exposure protective layer 328 of the second sub-pixel 54 shown in FIG. 4 are continuously formed on the entire surface (FIG. 5D). The first emission layer 408G included in the organic EL layer 326 formed in this step includes a material that emits green light.

Figure 6A:
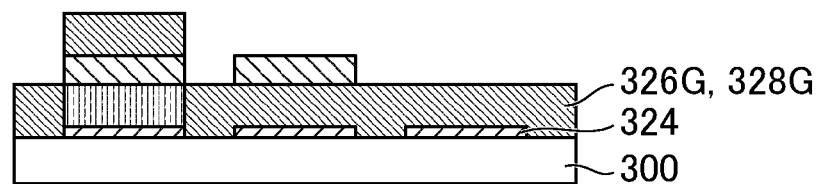
FIGS. 6A to 6D are diagrams for explaining a method of manufacturing the organic EL display device.

Next, a photoresist 500 is disposed on the lower electrode 324 of the second sub-pixel 54 (FIG. 6A). The step of FIG. 6A is the same as the step shown FIG. 5B except for the position where the photoresist 500 is disposed.

Figure 6B:
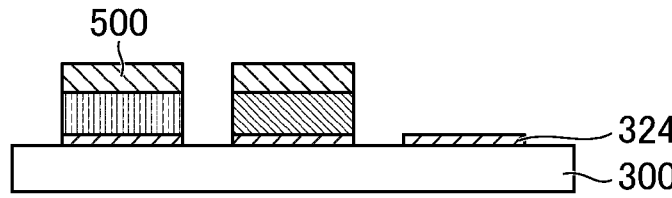

Next, etching is performed (FIG. 6B). Specifically, dry etch removal of the organic EL layer 326 and the exposure protective layer 328 of the second sub-pixel 54 is performed in the entire area where the photoresist 500 is not disposed in the step shown in FIG. 6A. The organic EL layer 326 and the exposure protective layer 328 formed in the step shown in FIG. 5D are etched and left only in the area below the photoresist 500 disposed in the step of FIG. 6A.

Figure 6C:
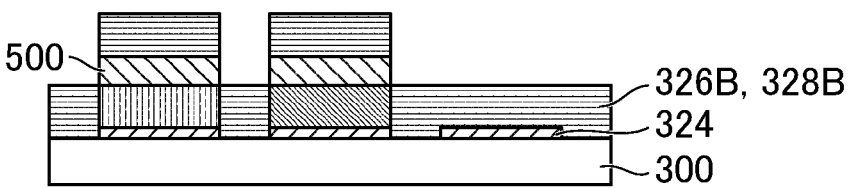

Next, on the entire surface, each layer (eight layers from the first hole injection layer 402 to the first protective hole transport layer 416) included in the organic EL layer 326 and the exposure protective layer 328 of the third sub-pixel 56 shown in FIG. 4 is continuously formed (see FIG. 6C). The first emission layer 408B included in the organic EL layer 326 formed in this process includes a material that emits blue light.

Figure 6D:
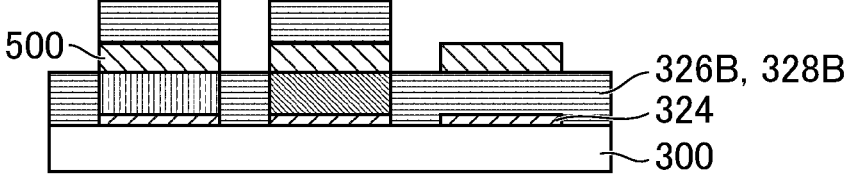

Next, a photoresist 500 is disposed on the lower electrode 324 of the third sub-pixel 56 (FIG. 6D). The step of FIG. 6D is the same as the step shown FIG. 5B except for the position where the photoresist 500 is disposed.

Figure 7A:
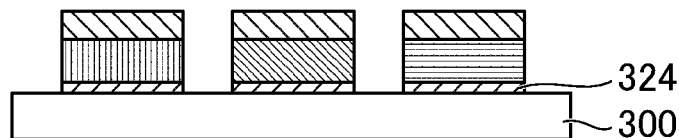
FIGS. 7A to 7D are diagrams for explaining a method of manufacturing the organic EL display device.

Next, etching is performed (FIG. 7A). Specifically, dry etch removal of the organic EL layer 326 and the exposure protective layer 328 of the third sub-pixel 56 is performed in the entire area where the photoresist 500 is not disposed in the step shown in FIG. 6D. The organic EL layer 326 and the exposure protective layer 328 formed in the step shown in FIG. 6C are etched and left only in the area below the photoresist 500 disposed in the step of FIG. 6D.

Figure 7B:
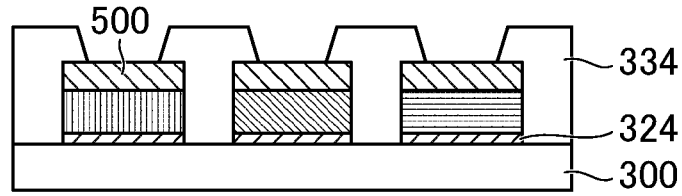

Next, a bank 334 to partition adjacent sub-pixels is arranged between adjacent sub-pixels (FIG. 7B). Specifically, the banks 334 shown in FIG. 7B are formed by depositing materials of the banks 334 between the sub-pixels to the ends of the respective layers formed in FIGS. 5A to 7A using a metal mask, for example. The bank 334 may be formed by photolithography without using a metal mask.

Figure 7C:
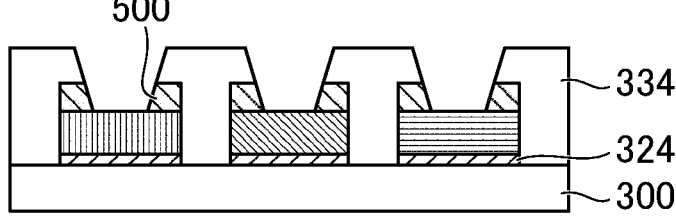

Next, the photoresist 500 is partially removed (FIG. 7C). Specifically, for example, an area of a photoresist 500 disposed in each sub-pixel that is not covered by the bank 334 is removed by etching. The area where the photoresist 500 is removed is an area (emission area) from which light of each sub-pixel is extracted.

Figure 7D:
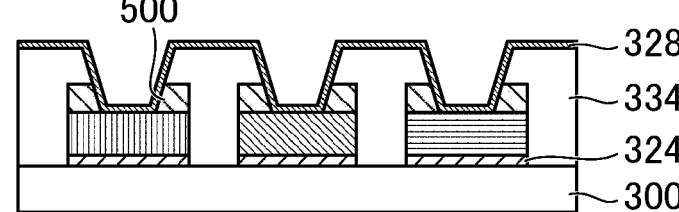

Next, an upper electrode 44 is formed (FIG. 7D). Specifically, for example, a transparent conductive film, such as ITO (indium tin oxide), to be a material of the upper electrode 44, is formed over the entire surface. The upper electrode 44 is formed as a layer common to the sub-pixels, and thus, formed not only on the emission area of each sub-pixel but also on the banks 334. Subsequently, a sealing film 330 and a protective film 336, which are not shown, are formed on the upper electrode 44, and the organic EL display device 2 is thereby completed.

As shown in FIG. 7D, the photoresist 500 remains below the bank 334. However, a step of removing all of the photoresist 500 may be added after the step of FIG. 7A so that the organic EL display device 2 is manufactured in a way not to leave the photoresist 500.

As described above, in the steps of FIGS. 5B and 5C, the uppermost surface of the exposure protective layer 328 is exposed to the atmosphere or a solvent so as to dispose and etch the photoresist 500. In the present embodiment, the uppermost surface of the exposure protective layer 328 is the first protective hole transport layer 416, and an emission layer is not formed between the exposure protective layer 328 and the upper electrode 44. Typically, the material of the hole transport layer is less deteriorated by exposure to the atmosphere and a solvent than the material of the electron transport layer and the emission layer. As such, according to the present embodiment, the electron transport layer and the emission layer are protected by the first protective hole transport layer 416 included in the exposure protective layer 328, whereby the electron transport layer and the emission layer included in the organic EL layer 326 can be prevented from being deteriorated due to the exposure to the atmosphere or a solvent. Further, the material of the first protective hole transport layer 416 is the same as that of the first hole injection layer 402, and thus a new material is not required, which serves to prevent an increase in manufacturing cost.

In the steps of FIGS. 6A, 6B, 6D, and 7A, the uppermost surface of the exposure protective layer 328 is exposed to air or a solvent so as to dispose and etch the photoresist 500 similarly to FIGS. 5B and 5C. As such, it is possible to prevent the electron transport layer and the emission layer of not only the first sub-pixel 52 but also the second sub-pixel 54 and the third sub-pixel 56 from being deteriorated due to the exposure to the atmosphere or the solvent.

Figure 8:
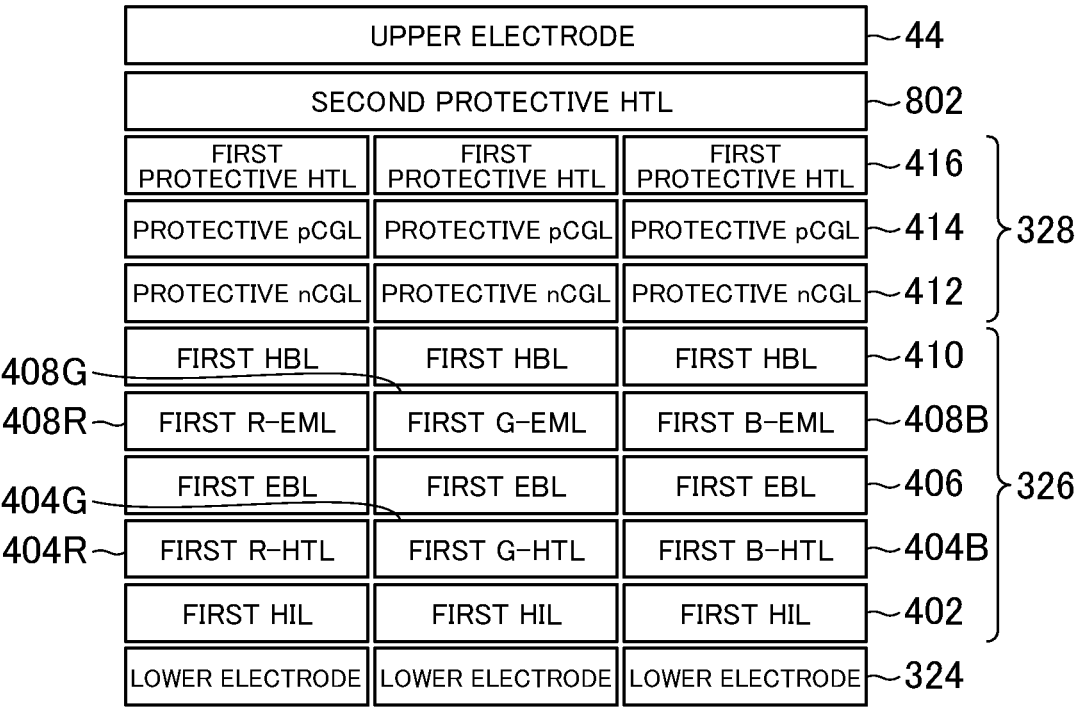
FIG. 8 is a diagram illustrating a layer structure of the organic EL layer and the exposed protective layer according to a modification of the first embodiment.

FIG. 8 is a diagram for describing the structure of the organic EL layer 326 and the exposure protective layer 328 according to the modification of the first embodiment, and schematically illustrates the layers from the lower electrode 324 to the upper electrode 44. The modification shows different structure of the exposure protective layer 328. In the modification, a second protection hole transport layer 802 is further laminated on the exposure protective layer 328. The second protective hole transport layer 802 is in contact with the upper side of the first protection hole transport layer 416 provided for each sub-pixel and is provided in common to the sub-pixels. The structure of the organic EL layer 326 is the same as that of the embodiment.

Specifically, the second protective hole transport layer 802 according to the modification uses the same material as the first protective hole transport layer 416 and is formed on the first protective hole transport layer 416 as a layer common to the sub-pixels. An emission layer is not formed between the second protective hole transport layer 802 and the upper electrode 44, and the second protective hole transport layer 802 is in contact with the upper electrode 44. As described above, the material of the hole transport layer is less deteriorated due to the exposure to the atmosphere and the solvent as compared with the material of the electron transport layer or the emission layer. In the above embodiment, the first protective hole transport layer 416 is exposed to the atmosphere and the solvent. According to the modification, even if the first protective hole transport layer 416 is exposed to the atmosphere and the solvent and changed in characteristics, the first protective hole transport layer 416 is covered with the second protective hole transport layer 802 that is not exposed to the atmosphere and the solvent, and thus the change in characteristics of the entire organic EL display device 2 can be reduced. The second protective hole transport layer 802 according to the modification is formed in the step between the steps of FIG. 7C and FIG. 7D, for example.

Second Embodiment

Next, the second embodiment will be described. FIG. 9 is a diagram for explaining the configuration of the organic EL layer 326 and the exposure protective layer 328 according to the second embodiment, and schematically shows the layer configuration from the lower electrode 324 to the upper electrode 44. Descriptions of the same configuration as that of the first embodiment are omitted.

As shown in FIG. 9, in the second embodiment, the organic EL layer 326 includes at least two emission layers for each sub-pixel, and the organic EL display device 2 has a tandem-structure. Specifically, the organic EL layer 326 includes a first hole injection layer 402, a first hole transport layer 404, a first electron blocking layer 406, a first emission layer 408, a first hole blocking layer 410, a charge generation layer, a second hole transport layer 906, a second electron blocking layer 908, a second emission layer 910, and a second hole blocking layer 912. The configurations of the layers from the first hole injection layer 402 to the first hole blocking layer 410 are the same as those of the first embodiment, and thus detailed explanation thereof is omitted.

The charge generation layer is disposed on the first hole blocking layer 410. Specifically, the charge generation layer is disposed on the first hole-blocking layer 410 for each sub-pixel, and includes nCGL 902 (n-type charge generation layer) and pCGL 904 (p-type charge generation layer). When a voltage is applied to the upper electrode 44 and the lower electrode 324, nCGL 902 generates electrons and pCGL 904 generates holes. The generated electrons are supplied to the first emission layer 408, and the generated holes are supplied to the second emission layer 910.

The second hole transport layer 906 is disposed on the charge generation layer. Specifically, for example, the second hole transport layers 906 are provided on pCGL 904 for the respective sub-pixels. A second hole transport layer 906R (second R-HTL in drawings) for a sub-pixel that emits red light is disposed on the second sub-pixel 54. The second sub-pixel 54 includes a first hole transport layer 906G (second G-HTL in drawings) for a sub-pixel that emits green light. The third sub-pixel 56 includes a second hole transport layer 906B (first B-HTL in drawings) for a sub-pixel that emits blue light. Each of the second hole transport layers 906 is formed in a thickness and a material that are appropriately determined in accordance with the color of light emitted by each of the sub-pixels.

The second electron blocking layer 908 (second EBL in drawings) is disposed on the second hole transport layer 906 to prevent electrons passing through the second emission layer 910 from reaching the second hole transport layer 906.

The second emission layer 910 is disposed on the second electron blocking layer 908 and emits red, green, or blue light. Specifically, each of the second emission layers 910 is formed on the second electron blocking layer 908 for each sub-pixel. For example, as described above, the pixel includes a first sub-pixel 52 that emits red light, a second sub-pixel 54 that emits green light, and a third sub-pixel that emits blue light. In this case, the second emission layer 910R (second R-EML in drawings) of the first sub-pixel 52 is formed of a material that emits red light, the second emission layer 910G (second G-EML in drawings) of the second sub-pixel 54 is formed of a material that emits green light, and the second emission layer 910B (second B-EML in drawings) of the third sub-pixel 56 is formed of a material that emits blue light. When the hole supplied from the charge generation layer is combined with the electron supplied from the protective nCGL 412, the second emission layer 910 emits light.

The second hole blocking layer 912 (second HBL in drawings) is disposed on the second emission layer 910 to prevent the hole that penetrates the second emission layer 910 from reaching the second electron transporting layer.

The exposure protective layer 328 is disposed on the organic EL layer 326 and includes a protective charge generation layer and a first protective hole transport layer 416. The configuration of the exposure protective layers 328 is the same as that of the first embodiment.

In the second embodiment, each sub-pixel includes two emission layers, which emit light. As such, the brightness can be improved as compared with the first embodiment.

In the second embodiment, in the step shown in FIG. 5A, the layers from the first hole injection layer 402 to the first protective hole transport layer 416 of the first sub-pixel 52 are formed. In the step shown in FIG. 5D, the layers from the first hole injection layer 402 to the first protective hole transport layer 416 of the second sub-pixel 54 are formed. In the step shown in FIG. 6C, the layers from the first hole injection layer 402 to the first protective hole transport layer 416 of the third sub-pixel 56 are formed. In the second embodiment as well, the uppermost surface of the exposure protective layer 328 is the first protective hole transport layer 416, and there is no emission layer between the exposure protective layer 328 and the upper electrode 44. As such, in the second embodiment as well, the electron transport layer and the emission layer are protected by the first protective hole transport layer 416 included in the exposure protective layer 328, whereby the electron transport layer and the emission layer included in the organic EL layer 326 can be prevented from being deteriorated due to the exposure to the atmosphere or a solvent.

Figure 10:
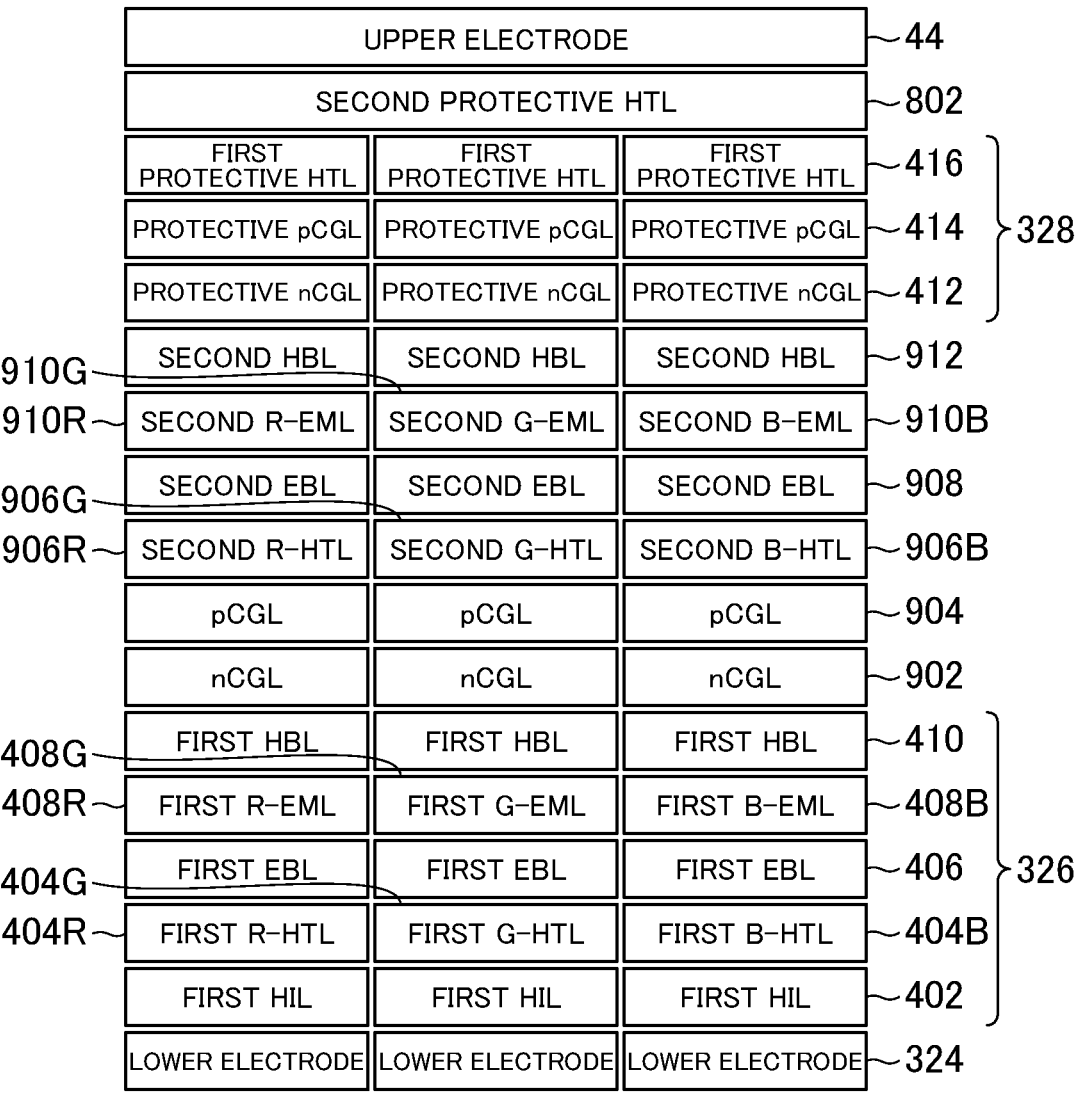
FIG. 10 is a diagram illustrating a layer structure of the organic EL layer and the exposed protective layer according to a modification of the second embodiment.

FIG. 10 is a diagram for describing the structure of the organic EL layer 326 and the exposure protective layer 328 according to the modification of the second embodiment, and schematically illustrates the layers from the lower electrode 324 to the upper electrode 44. Similarly to the modification of the first embodiment, the configuration of the organic EL layers 326 of this modification is the same as that of the first embodiment. A second protection hole transport layer 802 is further laminated on the exposure protective layer 328. The second protection hole transport layer 802 is in contact with the upper side of the first protection hole transport layer 416, which is provided for each sub-pixel, and is provided in common to each sub-pixel.

In this modification as well, the second protective hole transport layer 802 is formed on the first protective hole transport layer 416 using the same material as the first protective hole transport layer 416, whereby the change in characteristics of the entire organic EL display device 2 can be reduced.

While there have been described what are at present considered to be certain embodiments of the invention, it will be understood that various modifications may be made thereto, and it is intended that the appended claims cover all such modifications as fall within the true spirit and scope of the invention.

The invention claimed is:

1. An organic electroluminescence display device comprising:
   a substrate; and
   a plurality of pixels provided on the substrate, wherein
   each of the plurality of pixels includes a plurality of sub-pixels,
   each of the plurality of sub-pixels includes:
       a lower electrode provided on an upper side of the substrate;
       an organic EL layer including an emission layer that is disposed on the lower electrode and emits a different color for each sub-pixel;
       a resin layer covering a portion of an upper surface of the organic EL layer and having an aperture exposing another portion of the upper surface of the organic EL layer;
       a bank being in contact with a side surface of the lower electrode and a side surface of the organic EL layer, the bank covering an upper surface of the resin layer; and
       an upper electrode disposed on an upper side of the organic EL layer, wherein
   an exposure protective layer is disposed between the organic EL layer and the upper electrode,
   the exposure protective layer is in contact with the upper surface of the organic EL layer via the aperture,
   the exposure protective layer including a protective charge generation layer and a first protective hole transport layer that are laminated in this order for each sub-pixel, and
   the emission layer is not provided between the exposure protective layer and the upper electrode.

2. The organic electroluminescence display device according to claim 1, wherein
   the organic EL layer has a tandem structure in which at least two emission layers are included in each sub-pixel.

3. The organic electroluminescence display device according to claim 1, wherein
   the exposure protective layer includes a second protection hole transport layer that is in contact with the first protective hole transport layer and provided in common to the sub-pixels, the first protective hole transport layer being provided for each sub-pixel.

4. The organic electroluminescence display device according to claim 1, wherein
   the organic EL layer includes:
       a first hole injection layer that is disposed on the lower electrode;
       a first hole transport layer that is disposed on the first hole injection layer;
       a first electron blocking layer that is disposed on the first hole transport layer;
       a first emission layer that is disposed on the first electron blocking layer and emits red, green, or blue light; and
       a first hole blocking layer that is disposed on the first emission layer.

5. The organic electroluminescence display device according to claim 1, wherein
   the organic EL layer includes:
       a first hole injection layer that is disposed on the lower electrode;
       a first hole transport layer that is disposed on the first hole injection layer;
       a first electron blocking layer that is disposed on the first hole transport layer;
       a first emission layer that is disposed on the first electron blocking layer and emits red, green, or blue light;
       a first hole blocking layer that is disposed on the first emission layer;
       a charge generation layer that is disposed on the first hole blocking layer;
       a second hole transport layer that is disposed on the charge generation layer;
       a second electron blocking layer that is disposed on the second hole transport layer;
       a second emission layer that is disposed on the second electron blocking layer and emits red, green, or blue light; and
       a second hole blocking layer that is disposed on the second emission layer.

6. A method for manufacturing an organic electroluminescence display device that includes a substrate and a plurality of pixels provided on the substrate, the method comprising the steps of:
   forming a lower electrode on an upper side of the substrate;
   forming an organic EL layer on the lower electrode, the organic EL layer including an emission layer that emits a different color for each sub-pixel;
   forming a resin layer covering an upper surface of the organic EL layer;
   forming a bank on the resin layer;
   forming an aperture in the resin layer so as to expose a portion of the upper surface of the organic EL layer;
   forming an exposure protective layer that is in contact with the organic EL layer via the aperture and includes a protective charge generation layer and a first protective hole transport layer, which are laminated in this order for each sub-pixel; and
   forming an upper electrode on an upper side of the exposure protective layer, wherein an emission layer is not formed between the exposure protective layer and the upper electrode.

* * * * *